United States Patent
Vandebriel et al.

(10) Patent No.: US 10,382,042 B2
(45) Date of Patent: Aug. 13, 2019

(54) ASSEMBLY OF INTEGRATED CIRCUIT MODULES AND METHOD FOR IDENTIFYING THE MODULES

(71) Applicant: IMEC vzw, Leuven (BE)

(72) Inventors: Roeland Vandebriel, Lummen (BE); Geert Van der Plas, Leuven (BE); Vladimir Cherman, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/203,402

(22) Filed: Nov. 28, 2018

(65) Prior Publication Data
US 2019/0165791 A1 May 30, 2019

(30) Foreign Application Priority Data
Nov. 29, 2017 (EP) .................................... 17204275

(51) Int. Cl.
| | |
|---|---|
| *H03K 21/02* | (2006.01) |
| *G11C 5/04* | (2006.01) |
| *G11C 7/20* | (2006.01) |
| *H03K 5/153* | (2006.01) |
| *H01L 25/065* | (2006.01) |

(52) U.S. Cl.
CPC ............ *H03K 21/023* (2013.01); *G11C 5/04* (2013.01); *G11C 7/20* (2013.01); *H01L 25/0657* (2013.01); *H03K 5/153* (2013.01); *H03K 21/026* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,740,981 | B2 * | 5/2004 | Hosomi ................... | G11C 8/12 257/686 |
| 6,991,964 | B2 * | 1/2006 | Matsuo ............... | H01L 25/0657 257/E23.179 |
| 9,318,157 | B2 * | 4/2016 | Ito ........................... | G11C 5/04 |
| 9,478,502 | B2 * | 10/2016 | Satoh .................... | H01L 23/544 |
| 10,163,864 | B1 * | 12/2018 | England ............. | H01L 25/0657 |
| 2005/0082664 | A1 | 4/2005 | Funaba et al. | |

(Continued)

OTHER PUBLICATIONS

Partial European Search Report dated May 4, 2018, in European Application No. 17204275.6.

(Continued)

*Primary Examiner* — An T Luu
(74) *Attorney, Agent, or Firm* — Knobbe Martens Olson & Bear LLP

(57) ABSTRACT

An assembly including a carrier substrate and at least one group of interconnected integrated circuit modules mounted thereon is disclosed. The modules are provided with a connection for transmitting a clock signal through the group of interconnected modules. The modules are also provided with digital input ports and output ports and a logic circuit configured for identifying the position of the modules in the group on the basis of a count of the clock pulses, and on the basis of the logic state of the input and output ports. In one aspect, a method involves the transfer of a token in the form of one or more logic states, through the group of modules, from a first module to a last module, resulting in the identification of all modules in a progressive manner.

15 Claims, 5 Drawing Sheets

(56) References Cited

U.S. PATENT DOCUMENTS

| | | |
|---|---|---|
| 2011/0050320 A1 | 3/2011 | Gillingham |
| 2011/0102065 A1 | 5/2011 | Jin et al. |
| 2011/0148469 A1 | 6/2011 | Ito et al. |
| 2011/0260331 A1* | 10/2011 | Lee ..................... H01L 23/544 |
| | | 257/774 |
| 2011/0311018 A1 | 12/2011 | Chen et al. |
| 2014/0205056 A1 | 7/2014 | Yamamoto |

OTHER PUBLICATIONS

Extended European Search Report dated Aug. 17, 2018, in European Application No. 17204275.6.

* cited by examiner

ASSEMBLY OF INTEGRATED CIRCUIT MODULES AND METHOD FOR IDENTIFYING THE MODULES

CROSS-REFERENCE TO RELATED APPLICATION

This application claims foreign priority to European Patent Application No. 17204275.6, filed Nov. 29, 2017, which is incorporated by reference herein in its entirety.

BACKGROUND

Technological Field

The disclosed technology is related to the identification of integrated circuit (IC) modules in an assembly of such modules. A module can be an individual die or a portion thereof. One specific application is the identification of dies in a 3D stack of dies. In the latter case, the dies of the stack are also referred to as layers of the stack.

Description of the Related Technology

The identification of ICs in a plurality of interconnected dies, such as in a 3D stack, is necessary for the correct addressing of the individual dies. The orientation of the layers in present-day 3D stacks, i.e. which side of the layer is oriented upwards and which side is oriented downwards, is not necessarily constant. Most current methods for layer identification are, however, complex and incapable of identifying the orientation of the layers. In many cases, the number of dies in a 3D stack or other layer or die assembly needs to be known in advance, and dedicated connections are required in the individual dies for transmitting signals for the purpose of identifying the dies. The number of dedicated connections increases with the number of dies, resulting in complex layouts in each die as well as to complex identification methods. For example, U.S. Publication No. 2011/0102065 A1 from Jin et al. describes a clock signal and divided clock signals are passed upward in a stack of chips, to generate a chip identification signal to each of the chips in the stack. So three clock signals are needed to identify eight chips in the stack. Alternatively, U.S. Publication No. 2014/0205056 A1 from Yamamoto discloses an apparatus to assign a unique identifier to each device in a stacked package. Here, only one through substrate via (TSV) is used to pass the unique identifier of the preceding device to the subsequent device in the form of a number of pulses generated by the previous device. This comes at the cost of increased complexity to be added on each device for performing the identification methods. None of the above solutions allows for the detection of the orientation of the stacked devices.

SUMMARY OF CERTAIN INVENTIVE ASPECTS

The disclosed technology aims to provide an assembly of IC modules and an identification method for identifying the modules. One module may be an individual integrated circuit die or a portion thereof, for example a portion representing a group of pixels and related circuitry on an imaging sensor. An assembly according to the disclosed technology includes a carrier substrate and at least one group of interconnected modules, wherein the modules are provided with a connection for transmitting a clock signal through the group, and with digital input ports and output ports and a logic circuit configured for identifying the position of the modules in the group on the basis of a count of the clock pulses, and on the basis of the logic state of the input and output ports. The modules may be individual integrated circuit dies mounted on a carrier substrate, such as an interposer. The dies may be arranged in a planar configuration on the carrier substrate and interconnected through circuitry integrated in the carrier. Alternatively or in combination therewith, the dies may be arranged in one or more stacks. In the latter case, the dies are interconnected by contacts on their lower and upper surfaces. According to an embodiment, a stack of dies is provided wherein input ports and output ports are present on both sides of each die, configured to allow the detection of whether the die is at the top of stack or not, as well as the orientation of the die. The method of the disclosed technology involves the transfer of a token in the form of one or more logic states, through the group of modules, from a first module to a last module, resulting in the identification of all modules in a progressive manner. The assembly and method allow to identify the modules regardless of the number of modules in each group. The required number of signal connections in each module is limited and not dependent on the size of the group.

According to one aspect of the disclosed technology there is provided an assembly including a carrier substrate and on the substrate one or more groups of interconnected integrated circuit modules, each group including a first module, a last module and optionally one or more intermediate modules. Each module includes:
  a clock connection,
  a logic circuit connected to the clock connection and provided with a counter for counting the pulses of a clock signal transmitted through the clock connection,
  at least an input port and at least an output port, the input and output ports being coupled to the logic circuit, in such a manner that a logic state of the input port can be read by the circuit and a logic state of the output port can be driven by the circuit, and
  a memory for storing at least an identifier of the module,
wherein for each group of modules:
  the carrier substrate includes circuitry for accessing the input port of the first module of the group,
  the clock connections are interconnected to form a single connection from the first module to the last module of the group,
  except for the last module of the group, the output port on each module is directly connected to the input port of a module adjacent to it, so that the group of modules forms a chain of sequentially interconnected modules,
  the logic circuits are configured so that they are capable of driving the output ports of their respective modules to a predefined logic state, and
  the circuits are furthermore configured to monitor the logic state of the input and output ports of the respective modules at consecutive pulses of the clock signal, and to attribute the identifier sequentially for the chain of modules, on the basis of the counter value, and depending on the detected logic state of the input port and output port.

According to an embodiment, each module is an integrated circuit die, wherein at least one group of dies forms a stack of dies, each die having a top side and a bottom side, and wherein:
  the clock connection comprises a pass-through connection from the bottom side to the top side of each die, the at least one input port is located on the bottom side and the at least one output port is located on the top side of each die,
the first die is the bottom die of the stack and the last die is the top die of the stack, and
except for the top die of the stack, the output port on the top side of each die is directly connected to the input port of the die directly above it.

According to an embodiment involving one or more stacks of dies, each die in the stack of dies also includes an input port on the top side and an output port on the bottom side, and wherein:
except for the top die of the stack, the input port on the top side of each die is directly connected to the output port on the bottom side of the die directly above it,
the logic circuit of each die is configured to determine whether the die is at the top of a stack or not, and to determine the orientation of the die, on the basis of the combined logic states of the input port on the bottom side and of the additional input port on the top side,
the logic circuit of each die is configured so that a transfer path may be created from the input port on the bottom side of the die to the output port on the top side of the die or from the input port on the bottom side of the die to the output port on the same bottom side of the die, depending on the orientation of the die, and
the dies in the stack are configured so that their input ports are in a predefined logic state when the stack is powered up, and so that the predefined logic state may be overruled by the logic circuit. This may be achieved by providing weak pull-up or pull-down resistors on the inputs, thereby configuring the input ports to be in a predefined logic state when the stack is powered up. The predefined logic state can be overruled.

According to an embodiment, the input port and the output port on the same side of dies of the stack are at a mutual distance that is the same for each die of the stack so that an output port and an input port on the top side of the bottom die or an intermediate die of the stack is directly connected, respectively, to an input port and an output port on the bottom side of the die directly above it in the stack, regardless of the orientation of the dies.

The input port and the output port on the same side of dies of the stack may be physically located directly opposite, respectively, the output port and the input port on the opposite side of the dies.

The input and output ports on the same side of the dies may be symmetrically opposed with respect to the pass-through connection.

The assembly may include a first stack and least one additional stack, wherein the input port of the bottom die of the additional stack is connected to the output port of the bottom die of the first stack.

According to an embodiment, each module is an integrated circuit die and at least one group of dies forms an array of dies on the surface of the carrier substrate.

According to another embodiment, each module is a portion of an integrated circuit die including a substrate portion and a FEOL/BEOL (Front End Of Line/Back End Of Line) portion, and the carrier substrate is the substrate portion of the die.

The assembly according to the disclosed technology may include a system controller configured at least to generate the clock signal. The system controller may furthermore be configured to control the state of the input port of the first module, or if applicable, the input port on the bottom side of the first die.

According to an embodiment, each module further includes a control unit configured to generate a clock signal and transmit the clock signal to the other modules.

According to another aspect of the disclosed technology there is provided a method for uniquely identifying each module in at least one group of modules of an assembly described herein, wherein each module includes an input port and an output port, the method including:
initiating for each module the counter to an initial value and driving the output ports of all modules of the group to a predefined logic state,
unless the input port of the first module of the group is maintained at the state opposite the predefined state, driving the input port of the first module to the state opposite the predefined state,
transmitting a sequence of clock pulses through the interconnected clock connections of the plurality of modules,
at each pulse or at each group of pulses of the sequence, taking the following actions:
verifying at least in each module that has not received an ID whether or not the state of the input port is opposite the predefined state,
if the module has not yet received an ID and if the state of the input port is opposite the predefined state, storing an ID for the module in the memory of the module, based on the counter value,
if the module has already received an ID or if the state of the input port is at the predefined state, taking no action with regards to the storing of an ID, and
incrementing the counter at least in each module that has not received an ID, and
repeating the previous step until the last module has received an ID.

According to an embodiment of the above-described method, the group of modules is a stack of dies, wherein all the dies in the stack have the same orientation.

According to another embodiment, the disclosed technology is related to a method for identifying the layers of one or more stacks of dies in an assembly as described herein, wherein each die includes an input port and an output port on both the bottom side and the top side. The method includes:
initializing the one or more stacks by powering up the stacks or by otherwise applying the pre-defined logic state to the input ports of all dies,
initiating for each die the counter to an initial value and driving the output ports of all the dies to the logic state opposite the predefined logic state,
driving the input port on the bottom side of the bottom die of the first stack (1a) of the one or more stacks to the state opposite the predefined state,
transmitting a sequence of clock pulses through the interconnected clock connections of the dies,
at a first pulse of the sequence, taking the following actions:
verifying for each die whether one of the input ports is at the predefined state,
if one of the input ports is at the predefined state, assigning the die as the top die of a stack,
if both input ports are at the opposite state, assigning the die as a stacked die,
optionally, determining and storing the orientation of the top die or dies, on the basis of which of the input ports of the top die is at the predefined state, and
driving all the output ports to the predefined state, at each further pulse or at each group of further pulses of the sequence, taking the following actions:

verifying at least in each die that has not received an ID whether or not the state of the input port on the bottom side is different from the state of the input port on the top side, if the die has not yet received an ID and if the state of the input port on the bottom side is different from the state of the input port on the top side:

storing an ID for the die in the memory of the die, based on the counter value, checking which of the input ports is in the predefined state and deriving therefrom the orientation of the die, and storing the orientation, this step being skipped for a top die if the orientation for this die has already been determined and stored, and setting a transfer path in the circuit from the input port on the bottom side of the die to the output port on the top side of the die or from the input port on the bottom side to the output port on the same bottom side, respectively, when the die is a stacked die or a top die, if the die has already received an ID or if the state of the input port is at the predefined state, taking no action as regards the storing of an ID, and incrementing the counter at least in each die that has not received an ID, and repeating the previous step until the last die of the one or more stacks has received an ID.

DETAILED DESCRIPTION OF CERTAIN ILLUSTRATIVE EMBODIMENTS

The disclosed technology is related to an assembly comprising a group of interconnected integrated circuit (IC) modules (i.e. dies or portions thereof), provided with a number of tools which enable the application of methods of the disclosed technology for identifying the modules in the assembly. The group may be a 3D stack of dies, as applied for example in memory cells, or a plurality of dies in a planar arrangement on the same surface of a substrate, or a plurality of integrated circuit modules arranged in a planar array on a single die. The latter two embodiments may be applied for example in imaging applications. In a stack of dies, the orientation of the dies may be pre-defined or not. One embodiment of the disclosed technology will first be explained in the case of a stack of dies with all dies having the same orientation. Many aspects of this embodiment are valid also for the planar embodiments (dies or portions thereof in a planar arrangement), as will be explained further in this description.

Figure 1:
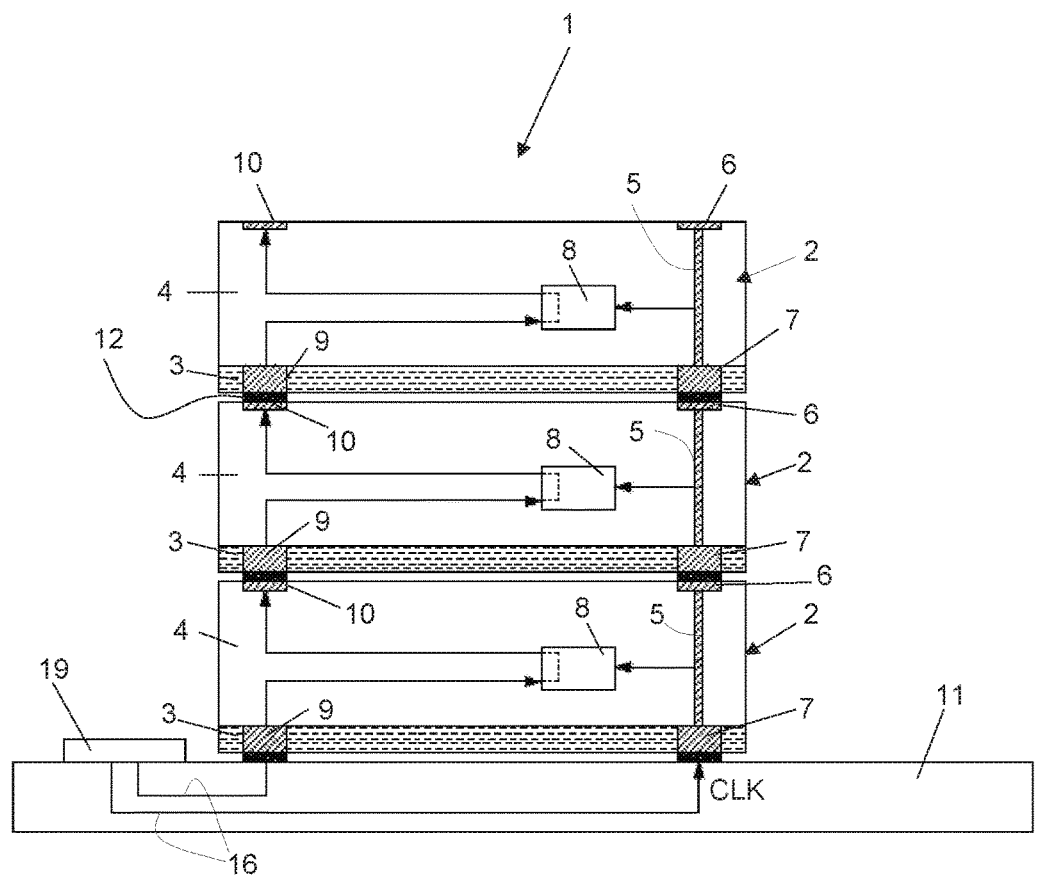
FIG. 1 shows a cross-section of an assembly of stacked dies in accordance with an embodiment of the disclosed technology, wherein the layers of the stack have the same orientation.

FIG. 1 shows a configuration according to a first embodiment of the disclosed technology, comprising a 3D stack 1 mounted on a carrier substrate 11, for example an interposer substrate. The stack comprises three dies 2. Each die comprises a FEOL/BEOL portion 3 (Front End Of Line/Back End Of Line) and a substrate portion 4. The FEOL portion at the interface between portions 3 and 4 comprises transistors or other active devices. The BEOL portion comprises interconnecting circuitry, in accordance with the functionality of the IC. These features and concepts can be implemented in any suitable manner known to the skilled reader. The substrate portion 4 and the FEOL/BEOL portion 3 define the orientation of the die in the stack, for example designated as 'substrate up' or 'substrate down'. A logic circuit 8 is schematically drawn separate from the FEOL/BEOL portion 3 in each die 2, as it represents a characteristic feature of the disclosed technology as will be explained in greater detail below. In reality, the circuit 8 is however preferably a part of the FEOL/BEOL portion of the die. Each die 2 further comprises a metal pass-through connection 5, such as a TSV (Through Substrate Via), coupled between an upper contact pad 6 and a lower contact pad 7. The pass-through connection 5 is dedicated in each die for transmitting a pulsed clock signal generated by an external system controller or by an oscillator circuit in one of the dies. For the sake of brevity, the pass-through connection 5 will hereafter be referred to as the 'clock TSV'. Two additional contact pads 9 and 10 are furthermore provided, respectively located on the FEOL/BEOL side and on the substrate side of each die 2 in the stack. These contact pads are coupled to the logic circuit 8 and referred to herein as the input port 9 and the output port 10. Again, the schematic representation of the dies 2 deviates from the preferred physical layout: when the logic circuit 8 is part of the FEOL/BEOL portion 3, the physical connection from the circuit 8 to the output port 10 on the substrate side requires an additional TSV. Also, the contact pads 9 and 7 on the FEOL/BEOL side of the dies do not in reality have the same thickness as the FEOL/BEOL portion 3. This representation is again schematic in order to visualize the interconnection from these contact pads to the logic circuit 8 and to the opposite side of the die. The contact pads 10 and 6 on the substrate side of the dies can be implemented in accordance with known layouts and methods.

The input port 9 is a unidirectional digital input that can be read by the circuit 8. The output port 10 is a unidirectional digital output that can be driven by the circuit 8. In other words, the circuit 8 can read a low or high state on the input port 9, and it can drive the output port 10 low or high. Except for the top die of the stack, the output port 10 of each die is directly connected (e.g., via metal bumps 12) to the input port 9 of the die directly above it. All clock TSVs 5 are interconnected and form a single signal path from the bottom up to the top of the stack. In each die 2, the clock TSV 5 is connected to the logic circuit 8, enabling the circuit to detect a clock signal CLK transmitted through the clock TSVs 5. Each logic circuit 8 comprises a counter (not shown) configured to increment as a function of the pulses of the CLK signal, and a memory (not shown) for storing an identifier for the die in which the circuit is built.

Figure 2:
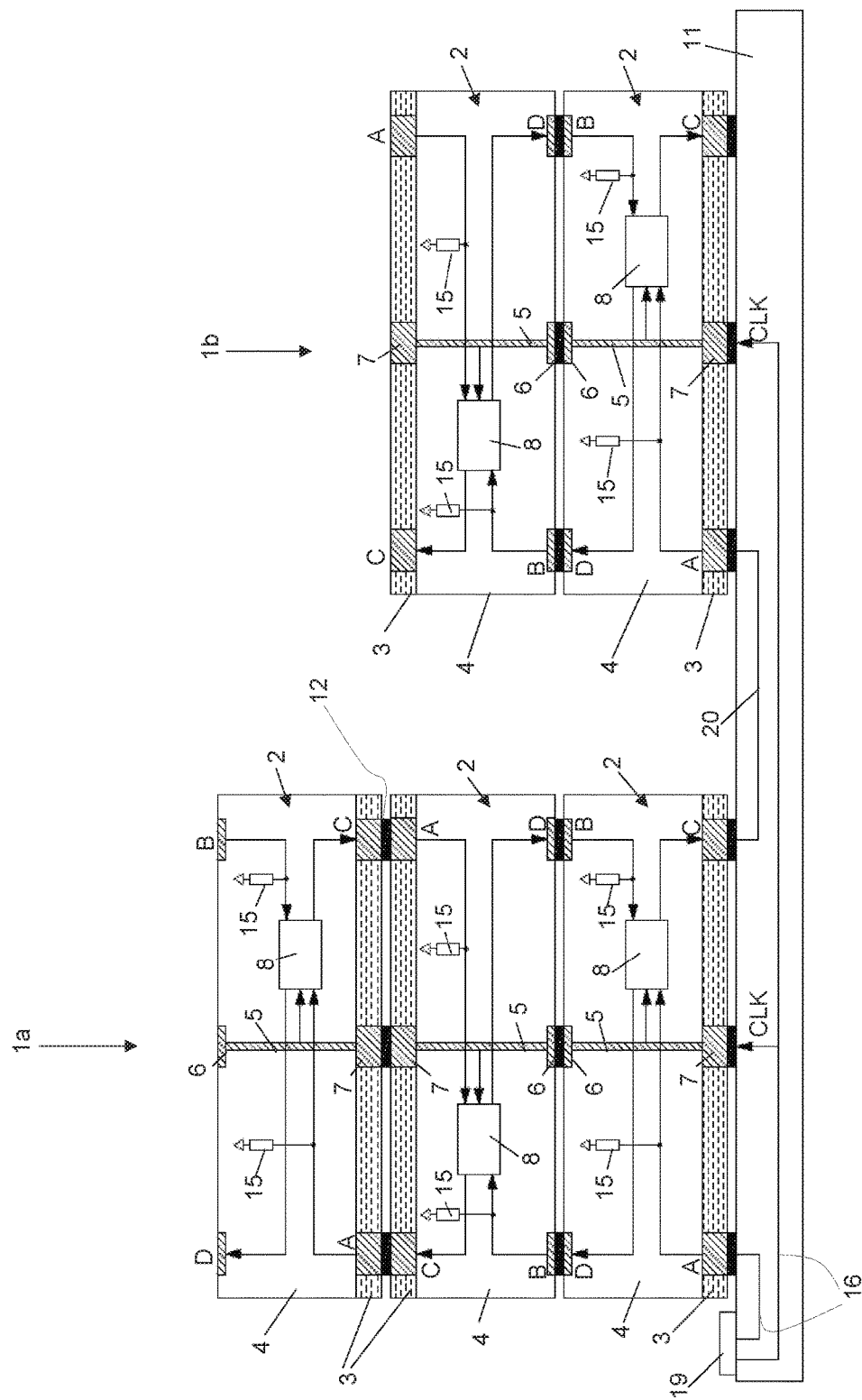
FIG. 2 shows a cross-section of an assembly including two stacks according to the disclosed technology, wherein the orientation of the layers is not constant.

In the assembly shown in FIG. 1, the dies 2 and their logic circuits 8 are configured for executing the method for identifying the dies in the stack, in accordance with the disclosed technology, for the case in which the orientation of the dies is fixed, i.e. all dies have the same orientation, for example the FEOL/BEOL portion 3 is facing downward, while the substrate portion 4 is facing upward. The steps of the method are explained hereafter. The method further requires a system controller 19, for transmitting a clock signal CLK on the interconnected clock TSVs 5, and possibly for driving the input port 9 of the bottom die of the stack to a predefined state. In the embodiments illustrated in FIGS. 1 and 2, the system controller 19 is coupled to the input port 9 of the bottom die and to the clock TSVs 5 through circuitry 16 within, on, or otherwise coupled to the carrier substrate 11. The system controller is shown as a block 19 on the carrier substrate 11. In reality, the controller may be implemented as a circuit incorporated in or on the carrier substrate 11 or in another substrate connected to the carrier substrate. The representation in FIGS. 1 and 2 is merely a symbolic and functional image of the system controller 19.

The logic circuits 8 are configured to drive their output ports 10 high at power-up of the stack (i.e. the design of the circuits is such that this action is taken at power-up). Equally at power-up or immediately thereafter, the system controller drives the input port 9 of the bottom die low. Alternatively, the input port 9 of the bottom die is tied to ground, i.e. this input remains at low logic input level at all times. The counters of the various dies 2 are set or reset to an initial count value, preferably this initial count value is zero. The system controller initiates the CLK signal and sends it to the interconnected clock TSVs and logic circuits 8 thereto connected. The logic circuits 8 receive the CLK signal and are configured to take predefined actions on the rising edge and on the falling edge of each pulse of the CLK signal. On the rising edge of every clock pulse, all connected logic circuits 8 increase their clock count by 1 and read the status of their input port 9. The clock count at which the input is read as 'low' is used for creating an identifier ID, for example starting with ID zero for the bottom die. On the falling edge of the clock pulse, the logic circuit of the just-identified die drives its output port 10 low. In the 3-layer stack of FIG. 1, the sequence runs as follows:

Power-up: all logic circuits 8 drive their output ports 10 high. The system controller 19 drives the input port 9 of the bottom die low. This latter action is not taken if the input port 9 of the bottom die is tied to ground.

Pulse 1: on the rising edge of the CLK signal the bottom die reads its input as 'low'. The clock count is 0. By consequence, ID 0 is stored in the memory of the module of the bottom die. Middle and top dies read their input 'high', so no ID is stored for these dies. The logic circuit of the bottom die, having received an identifier (this may be verified as a verification step in the circuit's programming), drives its output port low on the falling edge of the first pulse. This is equivalent to stating that the low state of the input port of the bottom die is transferred to its output port, through a vertical transfer path, symbolized by the dotted lines in FIG. 1. The input port 9 of the middle die is equally driven low as it is directly connected to the output port of the bottom die. The middle and top dies have not yet received an ID, so on the falling edge of the first pulse, the output ports of these dies remain high, and at least the dies that did not receive an ID increment their counter values by one.

Pulse 2: on the rising edge of the CLK signal, the middle die reads its input as 'low'. The clock count is 1. By consequence, ID 1 is stored in the memory of the module of the middle die. The bottom die reads its input as 'low', however its ID is already stored. The top die reads its input as 'high' so no ID is stored. On the falling edge of the second pulse, the middle die drives its output low and thereby also the input port of the top die. The bottom die already has its output low, so it remains low. The top die has not yet received an ID, so its output port remains high and its counter value is incremented. The counters of the circuits which have already received an ID may be disabled by inhibiting the clock TSV to these circuits once the ID is stored. This option saves power. This also makes it unnecessary to implement a verification at each clock pulse on whether or not an ID has already been received.

Pulse 3: on the rising edge of the pulse 3 of the CLK signal the top die reads its input as 'low'. The clock count is 2. By consequence, ID 2 is stored in the memory of the module of the top die. On the falling edge of the third pulse, the top die drives its output port 10 low and increases its counter by 1. The bottom and middle die read their inputs as 'low', but have their IDs already stored. The counter of these dies is either increased by 1 but no ID is stored when it is verified that ID has already been stored, or alternatively, their counters are disabled as soon as they receive an ID (by inhibiting the clock signal to these dies).

If the number of dies in the stack is known in advance, the process is stopped as soon as that number is reached. Alternatively, the process is run for a predefined number of pulses, higher than the total number of dies which are to be identified.

This method requires at least the clock TSV 5, the logic circuit 8, and one input port 9 and one output port 10 for each die in the stack, i.e. a limited amount of signal connections, while allowing to identify any number of dies 2 in a stack or in an equivalent group of dies or modules (see further embodiments described below). The signal connections are furthermore not dedicated solely to the identification process, but can be re-used for signal processing purposes.

FIG. 2 shows an assembly according to a second embodiment, configured to identify layers in multiple stacks 1*a*, 1*b* of dies interconnected by a connection 20 in the carrier substrate 11, and wherein the orientation of the dies 2 in the stacks is not constant, i.e. some dies have the substrate portion 4 oriented upwards, others have the substrate portion 4 oriented downwards. Like the previous embodiment, each die in the stacks according to this embodiment is provided with a clock TSV 5, coupled between contact pads 6 and 7, and configured so that the clock TSVs of the stacked dies are all interconnected from the bottom of the stack to the top, regardless of the orientation of the dies in the stack.

In addition, the dies comprise two digital input ports A and B and two digital output ports C and D. Input port A and output port C are located on the FEOL/BEOL side of each die, while input port B and output port D are located on the substrate side of each die. In embodiments as illustrated in FIG. 2, i.e. where every die in the stack has the same dimensions in the plane of the die and the stack is formed as a tower with a constant cross section, the physical location of ports A and C on one side of the die matches the physical locations of ports D and B on the other side, and these locations are the same for each die in the stack, so that the input and output ports on the top side and the bottom side of a die are directly connected (e.g., via metal bumps 12) to, respectively, an output and an input port of a die directly above and/or beneath it, regardless of the orientation of the dies in the stack. The disclosed technology is not limited to stacks of dies with equal dimensions however. In a stack of dies with various dimensions, the locations of ports A and C on one side need not necessarily match the locations of ports B and D on the other side. The distance between port A and port C are however preferably equal to the distance between port B and port D in each die, so that also in this case the input and output ports on the top side and the bottom side of a die are directly connected to, respectively, an output and an input port of a die directly above and/or beneath it, regardless of the orientation of the dies in the stack. In the embodiment shown in FIG. 2, the locations of the input port (A, B) and output port (C, D) on each side of the dies are symmetrically opposed with respect to the clock TSV 5, but this is not a requirement for the disclosed technology.

The input and output ports of each die are connected to a logic circuit 8 included in each die. Again, the drawings show a schematic representation, as the logic circuits 8 are preferably physically located in the FEOL/BEOL portion 3. The logic circuit 8 is configured to read the logic state of the input ports A and B and to drive the logic state of the output ports C and D. The circuits are furthermore capable of transferring the state of an input port according to a transfer path. The path may be vertical, i.e. from input A to output D and input B to output C, or horizontal, i.e. from input A to output C and from input B to output D. The circuit 8 is connected to the clock TSV 5 for detecting a clock signal CLK transmitted through this clock TSV 5. Each circuit 8 comprises a counter (not shown) for counting the CLK pulses. Each circuit 8 also comprises or is connected to a memory (not shown) for registering the ID of the die in the stack, as well as information on whether the die is at the top of the stack or not, and on the orientation of the die (substrate portion upward or downward). In addition, weak pull-up resistors 15 are coupled to the input ports A and B of all dies in the stacks. These pull-up resistors, when not overruled or overdriven, automatically set the input ports high during power-up, the function of which will be explained below. Also, a system controller 19 is included for driving the CLK signal. In this case, the controller also needs to be able to actively set the state of the input port of the bottom die, through the circuitry 16.

In the same way as for the embodiment of FIG. 1, the identification of the layers is based on the clock pulse count, but the ID phase of the method is preceded by a preliminary phase referred to as the '3D location phase'. It is aimed at registering in the memory of each die 2 whether it is at the top of the stack or not. The logic circuits 8 are configured to drive all their outputs low at power-up of the stacks, thereby overruling the weak pull-ups 15 of the inputs of the dies connected to those outputs. The output of a die or module that directly drives the weak pull-up 15 of an input of a connected die or module is stronger than the weak pull-up so as to overdrive the weak pull-up of the connected input. The input ports A and B which are directly connected to an output port C or D are thereby driven low as well, including (through connection 20) the input port A of the bottom die of the second stack 1b. Only the input port on the upper surface of the upper die of each stack is not directly connected to an output port, hence this input port remains high as a consequence of the weak pull-up resistor 15 connected to that input port. This explains the function of the weak pull-up resistors 15: ensuring that when a die is at the top of a stack, its upper input port (A or B, depending on the orientation) is not affected by the logic circuits 8 driving their output ports to a given logic state. Instead of a pull-up resistor, any other means known in the art may be applied, for enabling the above-described function. A pull-up resistor will always drive the inputs high if not overruled, but an alternative means may be implemented wherein the inputs can be chosen to be driven either high or low. This may be useful for applying the method on the basis of either a '0' being transmitted through the stack or a '1'.

Equally at power-up or immediately thereafter, the system controller drives the input port of the bottom side of the bottom die of the first stack 1a low. In one advantageous example, the counters of all circuits 8 are initiated to an initial count value, for example set or reset to zero. The system controller thereafter initiates a clock signal and transmits it to the interconnected clock TSVs 5. On the rising edge of the first clock pulse, all the inputs of the dies are then read. The dies which have one input that reads 'high' are labelled 'top' dies and the dies which have both inputs 'low' are labelled 'stacked' dies. The status 'top' or 'stacked' is stored in the memory of each die or module. In addition, the circuits 8 of the dies may be configured so that when the status is 'top', the circuit additionally registers the orientation of the die: when input A reads 'high', the substrate portion 4 of the top die is oriented downwards, whereas when input B reads 'high', the substrate portion 4 is oriented upwards. This second parameter may be called 'substrate up' or 'substrate down' and is registered as such in the memory of the top dies. Alternatively, this orientation parameter of the top dies may be detected during the identification phase of the method.

The 3D identification phase is initiated, on the falling edge of the first clock pulse: the logic circuits 8 drive all output ports C and D high, so that all the ports A, B, C, D are again driven high, except the input port on the bottom side of the bottom die of the first stack 1a. Starting from the next clock pulse, the logic circuits 8 of the dies perform the following tasks at each pulse:
  Checking if one of the inputs A or B is low, while the other is high,
  If one of the inputs is low and the other high, and if the ID has not yet been stored, storing the ID based on the counter in the manner described above in relation to FIG. 1 and continuing with the steps of:
  Checking whether input A or B is low;
  Depending on the outcome of the last check, setting the orientation parameter to 'substrate up' or 'substrate down'. This step may be skipped for the top dies of the stacks if these have already received an orientation parameter during the 3D location step (see above);
  Depending on the status of the location parameter, 'stacked' or 'top', setting a vertical or a horizontal transfer path, respectively, through the circuit, so that the low state may be transferred to the next die in the stack, or back down to the bottom of the stack.
  If neither of the inputs is low, the outputs are kept high and the counter is increased by one on the falling edge of the clock.
Possibly the above steps are performed only by the circuits 8 which have not yet received an ID. This may be achieved by disabling the clock registration of circuits which have received an ID.

When this sequence, including the 3D location phase, is applied to the stacks shown in FIG. 2, the following sequence takes place (in this sequence the clock count is disabled when an ID is received):
  Power-up: all circuits 8 drive their output ports C and D low, thereby driving input ports connected thereto equally low, including input port A of the bottom die of the second stack 1*b* (via connection 20); the system controller 19 drives the input port A of the bottom die of stack 1*a* low, all counters are initiated, for example set or reset to zero.

Pulse 1: on the rising edge of the first clock pulse, all circuits verify the status of their input ports A and B. The top die of the first stack 1*a* finds that input B is high, all other dies of the first stack find that both inputs A and B are low. Hence, the top die of stack 1*a* stores its status as 'top', the other dies store their status as 'stacked'. In stack 1*b*, the top die finds that input A is high, hence this die stores the status 'top', the other die of stack 1*b* stores the status 'stacked'. Possibly, based on the fact that respectively input ports B and A are high for the two stacks 1*a* and 1*b*, the 'top' dies store their orientation parameter as 'substrate up' and 'substrate down' respectively. On the falling edge of the first pulse, all circuits 8 drive their output ports C and D high.

Pulse 2: on the rising edge of the second clock pulse, the circuit of the bottom die of the first stack 1*a* finds that input A is low and input B is high. In accordance with the above-described algorithm, the circuit stores the ID of this die as ID=0 (clock pulses counted after initiation of the counter minus 1). Simultaneously, i.e. on the rising edge of the second pulse, all the circuits of the other dies, including the dies of the second stack 1*b*, find that both their input ports A and B are high, no further action is taken by these circuits on the rising edge. In the bottom die however, a number of further actions take place. As input A is low and not input B, the circuit of the bottom die stores the orientation parameter as 'substrate up'. The bottom die's circuit 8 then verifies the status of the location parameter and finds that it is 'stacked', i.e. the bottom die is a stacked die, it is not at the top of a stack. Hence, on the falling edge of the first pulse, the transfer path in the circuit 8 is set to vertical and the low state of the input port A is transferred to output port D. On the falling edge the counter of the non-identified dies are increased.

Pulse 3: on the rising edge of the third pulse, the bottom die of the first stack 1*a* still finds that input A is low and input B high, but as this die has already received an ID, no further action is taken. The second die of the first stack 1*a* now finds that its input B is low and its input A high. As it hasn't yet received an ID, its circuit registers this die's identifier as ID=1. This time, input B is low so the orientation parameter is set to 'substrate down'. Finally, the position parameter is 'stacked', so that on the falling edge of the second pulse, the vertical path is created, thereby driving the output port C of the second die low. All subsequent dies of the first stack 1 and the dies of the second stack 1*b* increment their counter by 1 on the falling edge but having found both inputs to be high, no actions are taken for these subsequent dies.

Pulse 4: on the rising edge of the fourth pulse, no action is taken for the bottom die and the middle die of the first stack 1*a*, as these dies have already received an ID. The top die finds that its input A is low and its input B is high, so it receives ID=2. Unless the orientation of the top die has already been stored during the 3D location phase, this orientation is now detected as 'substrate up' because input A is low while input B is high. As this die is a 'top' die, the transfer path is set to horizontal on the falling edge of the third pulse, and the low state of the top die's input A is transferred to its output C, which drives input A and output D of the middle die and input B and output C of the bottom die to the low state through the previously set vertical paths in these two dies, i.e. the low state is transferred from the top of the stack 1*a* to the bottom of the stack 1*a*, and through the carrier substrate to the input port of the bottom die of the second stack 1*b*. On the falling edge of the 4*th* pulse, all the remaining dies of the chain (i.e. the dies of the second stack 1*b*), increment their counter by 1.

Pulse 5: at the fifth rising edge, the bottom die of the second stack 1*b* has input A low and input B high, and is thus identified as ID=3, oriented 'substrate up' and the transfer path set to vertical. On the falling edge, all the subsequent dies of the second stack 1*b* increment their counter.

Pulse 6: at the sixth rising edge, the second die of the second stack 1*b* is identified as ID=4, 'substrate down' and the transfer path is set to horizontal, When the number of dies in the two stacks is known in advance, all dies have been identified at this point and the process is stopped. Alternatively, the process is run for a predefined number of pulses, higher than the total number of dies which are to be identified. Another alternative way to end the process is that the system controller 19 monitors the output port on the bottom side of the bottom die of the last stack of a chain of stacks. When this output port goes low, the process stops. The advantage is that the 3D stack connection is verified via this feedback loop monitoring the output port of the last module of the chain.

In the embodiment of FIG. 2, weak pull-down resistors may be applied instead of weak pull-up resistors 15, in which case the method remains unchanged, except for the reversal of 'high' and 'low' throughout the method steps. For example, upon power-up, the logic circuits 8 drive the output ports 'low' in this case. The 3D location phase will involve driving all the ports high except the input port on the top side of the top die. The logic states referred to as 'high' and 'low' may in fact be reversed in any embodiment according to the disclosed technology. In a more general way, it can be said that the input and output ports can be driven to one or the other of a pair of mutually opposed logic states. Also, the word 'resistor' in the terms 'weak pull-up resistor' or weak pull-down resistor' is not to be interpreted narrowly. A weak pull-down resistor may, for example, be realised as a transistor. Instead of tying the gate to a fixed voltage, the gate may be controlled to remove the weak pull-down after identification has been completed, to avoid leakage. This technique can be implemented in any suitable manner known to the skilled person.

Figure 3A:
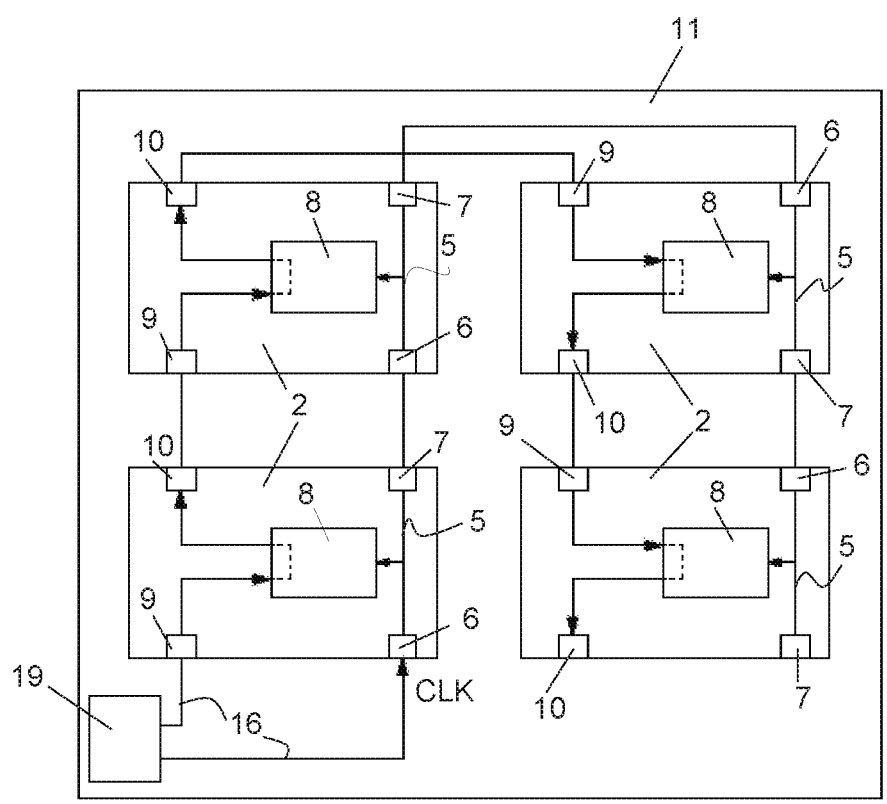
FIG. 3A illustrates a top view of a planar assembly of dies according to an embodiment of the disclosed technology.

FIG. 3A illustrates an example of a planar assembly of dies in accordance with the disclosed technology, wherein the dies 2 are mounted as a regular array of dies on a carrier substrate 11. All dies are oriented with their FEOL/BEOL side downward, i.e. in contact with the carrier substrate. The carrier substrate 11 further comprises circuitry for interconnecting the dies. Each die comprises a logic circuit 8, logic input port 9 and output port 10 and a clock connection 5 between contact pads 6 and 7. The clock connection 5 can be read by the logic circuit 8. The logic circuit may be the same as the one used in the embodiment of FIG. 1. The output ports 10 of each die except the lower right die, is connected to the input port 9 of an adjacent die in the array. The lower left die's input port 9 and clock connection contact pad 6 are connected to a system controller 19 through circuitry 16. Alternatively, the lower left die's input port may be permanently maintained at a predefined logic state (e.g. tied to ground). The system controller 19 is configured to send a clock signal to the interconnected clock connections 5 of all the dies, and to set the input port 9 of the lower left die to a given state in order to start the identification sequence (alternatively the input port is tied to a given state). This sequence runs in the same way as described above in relation to the stack of FIG. 1. The method of the disclosed technology is thus applicable also to a planar plurality of dies. As the group is a planar assembly of dies, the method may in this case be applied to multiple groups of dies placed at various locations on a substrate. The output port of the lower right die in FIG. 3A may be connected to the input port of the first die of another group of dies, or of a stack of dies. So these several groups may be identified by a single sequence of the method as described in relation to FIG. 1.

Figure 3B:
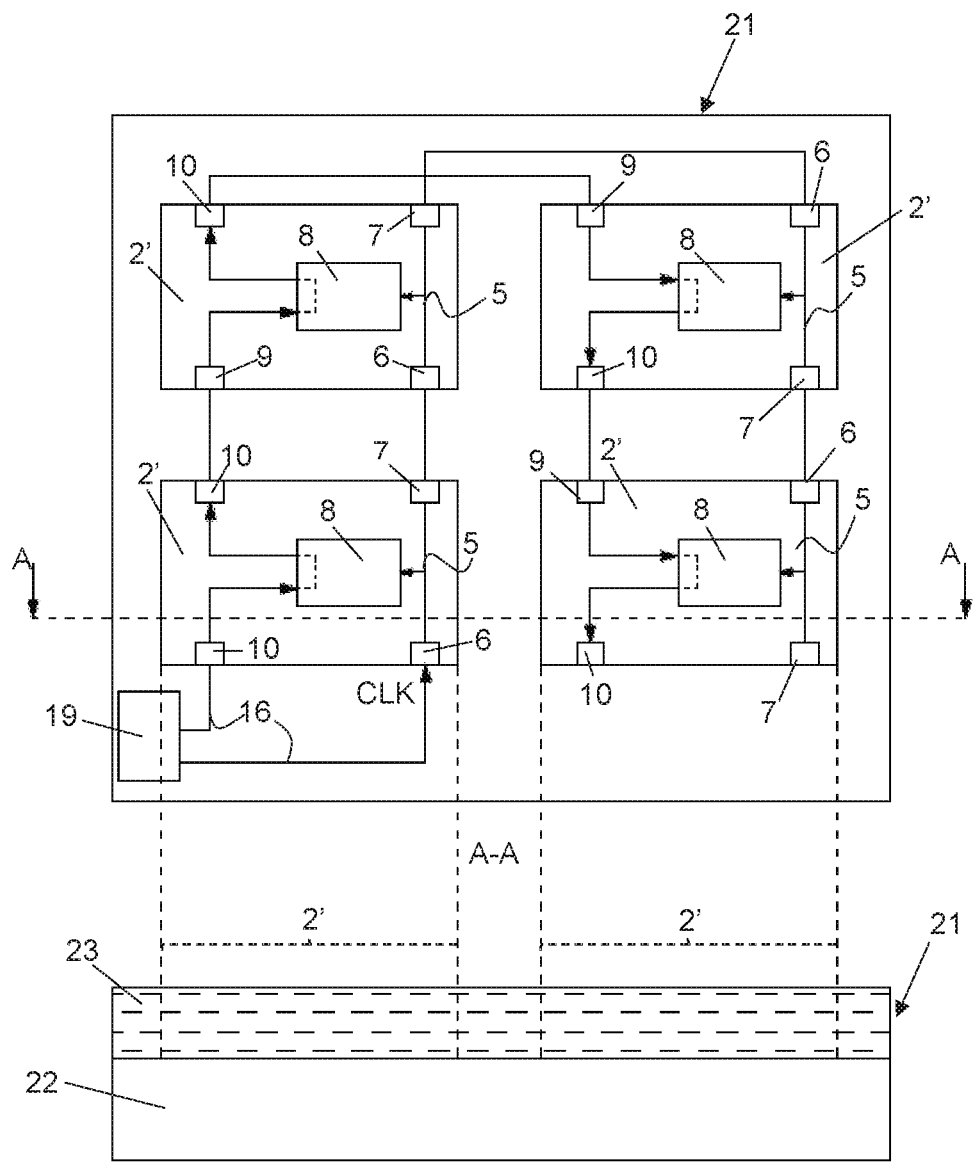
FIG. 3B shows a top view and cross-section of an embodiment of an assembly of integrated circuit modules on a single die.

FIG. 3B illustrates an embodiment comprising a group of integrated circuit modules 2' arranged in a regular array on a single die 21. The carrier substrate is now the semiconductor substrate portion 22 of the die. The modules 2' are interconnected through circuitry in the FEOL/BEOL portion 23 of the die. The modules themselves comprise the same components having the same functionality as described in relation to FIG. 3A: clock connection 5, input-output ports 9-10, logic circuit 8. The system controller 19 is shown as a portion of the die itself, but the controller could also be located on another die or device connected to the die 21. The method applied in the case of FIG. 3A is thus applicable directly for the identification of the modules 2' in the case of FIG. 3B. This embodiment is applicable for example when the die 21 is an imaging sensor, wherein at least some of the modules 2' represent groups of pixels of the sensor.

The description of the sequences in the case of FIGS. 1, 2, 3A, and 3B are non-limiting examples of ways of performing the method of the disclosed technology in these cases, but not every detail of these sequences is a limiting feature of the scope of the disclosed technology. It will be understood that certain details may be brought into practice in a slightly different but equivalent way. For example, between the 3D location phase and the 3D identification phase in FIG. 2, the counters may be initiated, so that counting begins at the start of the ID-phase. The counters may count down instead of up. Also, actions do not necessarily take place on every rising and falling edge of the clock, nor is the disclosed technology limited to the precise description of actions taking place on the rising edge and falling edge of the clock pulses. What is important is that the identification takes place in a sequence that is defined by the clock. The most straightforward embodiment is as described above: an ID is stored at each clock pulse, but other embodiments may be imagined. The clock signal may for example be applied at twice the frequency with actions being taken only on the rising edges of the pulses, instead of on every rising and falling edge of the clock signal. The relation between the counter value and the ID may then need to be adapted, however any relation between counter and ID value can be chosen within the scope of the disclosed technology. In general terms, it can be said that a number of actions are taken at every pulse or at every group of pulses.

Also, the method as described in the above embodiments starts at power-up of the stacks or groups of dies or modules, i.e. when the dies or modules are connected to an electrical power source. Power-up is, however, not the only way in which the methods of the disclosed technology may be initiated. The methods of the disclosed technology can be applied without the need to power down the dies. This could be done by resetting all counters and IDs and initiating the above-described method in a suitable manner, for example by the system controller. In the embodiment of FIG. 2, the initialization includes any action that allows the pull-up resistors 15 to 'pull-up' the state of the input ports A and B of all the dies.

Figure 4:
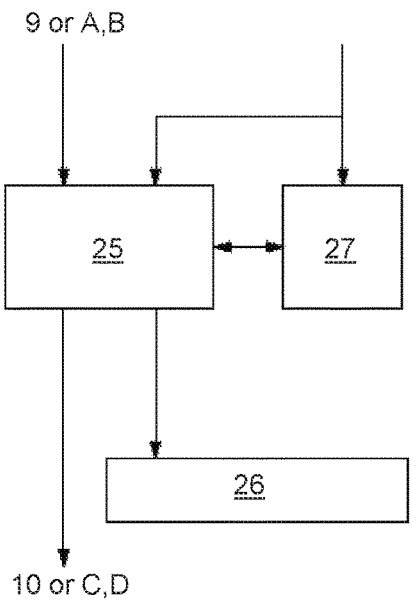
FIG. 4 shows an embodiment of the building blocks of the logic circuit included in the modules of an assembly according to an embodiment of the disclosed technology.

The building blocks of a logic circuit 8 applicable to any of the above-described embodiments are schematically shown in FIG. 4. The circuit may comprise a state controller 25 configured to read the state of the input 9 or inputs A and B, and to drive the state of the output 10 or outputs C and D, independently from the state of the inputs (e.g. driving outputs high at start-up) or as a function thereof (setting vertical or horizontal path). The state controller 25 is further configured to detect a clock signal CLK. The circuit further comprises a counter 27 that is incremented by the pulses of the clock signal. The state controller 25 is configured to store the identifier based on the counter value into a memory 26. The memory 26 may be a part of the circuit 8 or it may be separate from the circuit. In the embodiment of FIG. 2, the state controller is furthermore configured to store the 'location' parameter (stacked or top) and the 'orientation' parameter (substrate up or substrate down) in the memory 26. The layout of the state controller 25 is not described in detail as it is clear to the skilled reader on the basis of the functionality described above. Instead of the state controller 25, a suitably programmed microcontroller unit (MCU) could be used. Alternative implementations are possible as the skilled person will readily understand. As long as the described functions as given above are implemented, the operation will be guaranteed.

Figure 5:
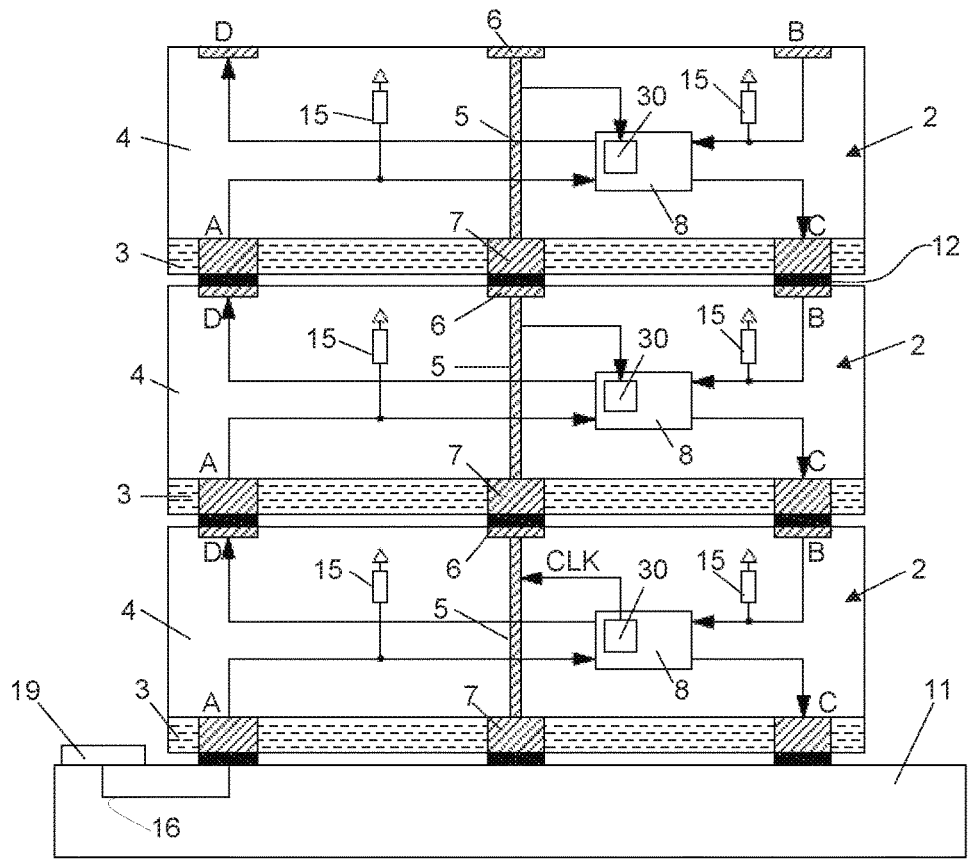
FIG. 5 shows a cross-section of a 3D stack assembly in accordance with an alternative embodiment.

According to an embodiment, each die 2 comprises a control unit, capable of generating a clock signal as described above, and capable of operating in master mode or slave mode. Before initiating the steps of the method of the disclosed technology as described above, i.e. before the 3D location phase in the case of FIG. 2, an assignation of which control unit will control or master the 3D location and ID phases is made. Only one master control unit is selected while the other control units operate in slave mode. The control unit included in each die may further comprise a clock oscillator as alternative source for the CLK signal. A stack according to this embodiment is illustrated in FIG. 5. The preliminary steps for identifying the master controller may be executed as follows. At power-up, all the input ports and output ports are driven high by the logic circuits 8. The input port of the bottom die is maintained low through connection 16 while all the other ports are high. The bottom die detects the low state of its input port A, and thereby the control unit 30 of this bottom die is assigned the function of master controller. From then on the control unit of the bottom die drives the clock TSVs 5 with the clock oscillator of that die as the source and initiates the method as described above (3D location phase and ID phase). The external controller 19 is only needed in this case for driving the input port A of the bottom die low to initiate the start of the 3D location or identification phase. When the control units 30 are present in the embodiments of FIGS. 1, 3A, and 3B, no external controller is needed if the input port 9 of the first die or module is permanently maintained low.

In the methods of the disclosed technology, it is the count of pulses between the initiation of the counter and the propagation of the low state of the first die that determines the ID value in each die. Each die in the sequence will therefore receive a unique ID that is sequentially attributed as the low state of the first die propagates through the chain (3D stack or sequence of dies or modules) on the pulses of the CLK signal. The identification phase described in relation to any of the embodiments is in fact a sequential process wherein a 'token' is transferred (at the rhythm of the CLK signal) from the bottom of the stack (or a first die or module) to the top (through subsequent connected dies or modules to a final connected die or module) and in the case of FIG. 2, back to the bottom towards a next stack. In more general wording the 'token' is transferred from the start of the chain to the end of the chain at the rhythm of the (divided) CLK signal. In the embodiment of FIG. 2, the token is a logic '0' detected on one of the input ports A or B while the other input port is at a logic '1'. The '0' and '1' may be reversed. For example in the embodiment of FIG. 2, when pull-down resistors are used instead of pull-up resistors, the token is a logic '1'.

According to another embodiment, the token is a combination of '1' and '0', i.e. it is a string of logic bits transmitted on a bus instead of on a single wire. In the latter embodiment, each die comprises multiple input ports and multiple output ports on each side of the die. This embodiment enables a token to be transmitted consisting of a well-defined string of bits, and which can be compared to a pre-defined token by the various circuits. This enables the identification phase to be performed multiple times with different tokens, each token being used for identifying a different sub-group of dies from the stacks. Alternatively, with the layouts described above, i.e. with not more than one input port and not more than one output port on each side of the dies, the method could be repeated several times, so as to transfer a string of bits in a sequential manner through the group or groups of dies.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. An assembly comprising a carrier substrate and on the substrate one or more groups of interconnected integrated circuit modules, each group comprising a first module, a last module, and one or more intermediate modules, wherein each module comprises:
   a clock connection;
   a logic circuit connected to the clock connection and provided with a counter for counting the pulses of a clock signal transmitted through the clock connection;
   at least an input port and at least an output port, the input and output ports being coupled to the logic circuit, in such a manner that a logic state of the input port can be read by the circuit and a logic state of the output port can be driven by the circuit; and
   a memory for storing at least an identifier of the module, wherein for each group of modules:
   the carrier substrate comprises circuitry for accessing the input port of the first module of the group;
   the clock connections are interconnected to form a single connection from the first module to the last module of the group;
   except for the last module of the group, the output port on each module is directly connected to the input port of a module adjacent to it, so that the group of modules forms a chain of sequentially interconnected modules;
   the logic circuits are configured so that they are capable of driving the output ports of their respective modules to a predefined logic state; and
   the circuits are further configured to monitor the logic state of the input and output ports of the respective modules at consecutive pulses of the clock signal, and to attribute the identifier sequentially for the chain of modules, on the basis of the counter value, and depending on the detected logic state of the input port and output port.

2. The assembly according to claim 1, wherein each module is an integrated circuit die, and wherein at least one group of dies forms a stack of dies, each die having a top side and a bottom side, and wherein:
   the clock connection comprises a pass-through connection from the bottom side to the top side of each die;
   the at least one input port is located on the bottom side and the at least one output port is located on the top side of each die;
   the first die is the bottom die of the stack and the last die is the top die of the stack; and
   except for the top die of the stack, the output port on the top side of each die is directly connected to the input port of the die directly above it.

3. The assembly according to claim 2, wherein each die in the stack of dies further comprises an input port on the top side and an output port on the bottom side, and wherein:
   except for the top die of the stack, the input port on the top side of each die is directly connected to the output port on the bottom side of the die directly above it;
   the logic circuit of each die is configured to determine whether the die is at the top of a stack or not, and to determine the orientation of the die, on the basis of the combined logic states of the input port on the bottom side and of the additional input port on the top side;
   the logic circuit of each die is configured so that a transfer path may be created from the input port on the bottom side of the die to the output port on the top side of the die or from the input port on the bottom side of the die to the output port on the same bottom side of the die, depending on the orientation of the die; and
   the dies in the stack are configured so that their input ports are in a predefined logic state when the stack is powered up, and so that the predefined logic state may be overruled by the logic circuit.

4. The assembly according to claim 3, wherein the input port and the output port on the same side of dies of the stack are at a mutual distance that is the same for each die of the stack so that an output port and an input port on the top side of the bottom die or an intermediate die of the stack is directly connected, respectively, to an input port and an output port on the bottom side of the die directly above it in the stack, regardless of the orientation of the dies.

5. The assembly according to claim 4, wherein the input port and the output port on the same side of dies of the stack are physically located directly opposite, respectively, the output port and the input port on the opposite side of the dies.

6. The assembly according to claim 3, wherein all the input ports are provided with weak pull-up resistors or weak pull-down resistors, thereby configuring the input ports to be in a predefined logic state when the stack is powered up, and wherein the predefined state can be overruled.

7. The assembly according to claim 3, further comprising a first stack and least one additional stack, wherein the input port of the bottom die of the additional stack is connected to the output port of the bottom die of the first stack.

8. The assembly according to claim 1, wherein each module is an integrated circuit die, and wherein at least one group of dies forms an array of dies on the surface of the carrier substrate.

9. The assembly according to claim 1, wherein each module is a portion of an integrated circuit die comprising a substrate portion and a FEOL/BEOL portion, and wherein the carrier substrate is the substrate portion of the die.

10. The assembly according to claim 1, further comprising a system controller configured to generate the clock signal.

11. The assembly according to claim 10, wherein the system controller is further configured to control the state of the input port of the first module.

12. The assembly according to claim 1, wherein each module further comprises a control unit configured to generate a clock signal and transmit the clock signal to the other modules.

13. A method for uniquely identifying each module in at least one group of modules of an assembly according to claim 1, wherein each module comprises an input port and an output port, the method comprising:
    initiating for each module the counter to an initial value and driving the output ports of all modules of the group to a predefined logic state;
    unless the input port of the first module of the group is maintained at the state opposite the predefined state, driving the input port of the first module to the state opposite the predefined state;
    transmitting a sequence of clock pulses through the interconnected clock connections of the plurality of modules,
    at each pulse or at each group of pulses of the sequence, taking the following actions:
        verifying at least in each module that has not received an ID whether or not the state of the input port is opposite the predefined state;
        if the module has not yet received an ID and if the state of the input port is opposite the predefined state, storing an ID for the module in the memory of the module, based on the counter value;
        if the module has already received an ID or if the state of the input port is at the predefined state, taking no action as regards the storing of an ID; and
        incrementing the counter at least in each module that has not received an ID; and
    repeating the previous step until the last module has received an ID.

14. The method according to claim 13, wherein the group of modules is a stack of dies, and wherein all the dies in the stack have the same orientation.

15. A method for identifying the layers of one or more stacks of dies in an assembly according to claim 3, wherein each die comprises an input port and an output port on both the bottom side and the top side, the method comprising:
    initializing the one or more stacks by powering up the stacks or by otherwise applying the pre-defined logic state to the input ports of all dies;
    initiating for each die the counter to an initial value and driving the output ports of all the dies to the logic state opposite the predefined logic state;
    driving the input port on the bottom side of the bottom die of the first stack of the one or more stacks to the state opposite the predefined state;
    transmitting a sequence of clock pulses through the interconnected clock connections of the dies;
    at a first pulse of the sequence, taking the following actions:
        verifying for each die whether one of the input ports is at the predefined state;
        if one of the input ports is at the predefined state, assigning the die as the top die of a stack;
        if both input ports are at the opposite state, assigning the die as a stacked die;
        optionally, determining and storing the orientation of the top die or dies, on the basis of which of the input ports of the top die is at the predefined state; and
        driving all the output ports to the predefined state;
    at each further pulse or at each group of further pulses of the sequence, taking the following actions:
        verifying at least in each die that has not received an ID whether or not the state of the input port on the bottom side is different from the state of the input port on the top side;
        if the die has not yet received an ID and if the state of the input port on the bottom side is different from the state of the input port on the top side:
            storing an ID for the die in the memory of the die, based on the counter value;
            checking which of the input ports is in the predefined state and deriving therefrom the orientation of the die, and storing the orientation, this step being skipped for a top die if the orientation for this die has already been determined and stored; and
            setting a transfer path in the circuit from the input port on the bottom side of the die to the output port on the top side of the die or from the input port on the bottom side to the output port on the same bottom side, respectively, when the die is a stacked die or a top die;
        if the die has already received an ID or if the state of the input port is at the predefined state, taking no action with regard to the storing of an ID; and
        incrementing the counter at least in each die that has not received an ID; and
    repeating the previous step until the last die of the one or more stacks has received an ID.

* * * * *